United States Patent [19]

Uchida

[11] Patent Number: 4,692,396
[45] Date of Patent: Sep. 8, 1987

[54] PHOTOPOLYMERIZABLE RESIN COMPOSITION FOR PRODUCING AQUEOUS-DEVELOPMENT TYPE DRY FILM RESISTS

[76] Inventor: Hiroyuki Uchida, 5-10, Nishisakae-2-chome, Ohtake-shi, Japan

[21] Appl. No.: 719,567

[22] Filed: Apr. 3, 1985

[30] Foreign Application Priority Data

Apr. 10, 1984 [JP] Japan .................................. 59-71348

[51] Int. Cl.[4] ........................... G03C 1/68; C08F 8/00
[52] U.S. Cl. .................................... 430/284; 430/910; 430/288; 430/281; 430/285; 522/114; 522/121; 522/95; 522/44; 522/43; 522/46; 522/47
[58] Field of Search .............. 430/910, 288, 281, 284, 430/285, 327; 204/159.16; 522/114, 121, 95, 44, 43, 46, 47

[56] References Cited

U.S. PATENT DOCUMENTS

| 3,475,171 | 10/1969 | Alles | 96/35.1 |
| 3,804,631 | 4/1974 | Faust | 96/35.1 |
| 3,833,384 | 9/1974 | Noonan et al. | 430/288 X |
| 3,895,949 | 7/1975 | Akamatsu et al. | 430/288 X |

FOREIGN PATENT DOCUMENTS 1521372  8/1978  United Kingdom ................ 430/910

Primary Examiner—John E. Kittle
Assistant Examiner—Cynthia Hamilton

[57] ABSTRACT

A photopolymerizable resin composition for aqueous-developing type dry film resists which comprises
(A) 40 to 85% by weight of a binder resin comprising a copolymer of methyl methacrylate, methyl acrylate and methacrylic acid,
(B) 15 to 60% by weight of a crosslinkable monomer having at least two ethylenically unsaturated groups in the molecule, and
(C) 0.5 to 10% by weight, based on the total amount of the above components (A) and (B), of a photoinitiator.

4 Claims, No Drawings

PHOTOPOLYMERIZABLE RESIN COMPOSITION FOR PRODUCING AQUEOUS-DEVELOPMENT TYPE DRY FILM RESISTS

TECHNICAL FIELD

This invention relates to a photopolymerizable resin composition used in particular for forming aqueous-developing type dry film resist for printed circuit boards.

PRIOR ART

Binder resins to be used in aqueous-developing type dry film resist must be soluble or swellable in dilute aqueous alkaline solution and, further, insoluble in water. Such binder resins heretofore used are vinyl addition polymers containing carboxyl groups. In commercially available aqueous-developing type resists, in particular, the content of carboxyl groups incorporated as the copolymerized component is controlled to the minimum required for enabling the resolution of minute patterns in developing. Further, such resists are so designed, by proper selection of copolymerizable components other than the vinyl monomers containing carboxyl groups, as to give a low solubility in aqueous alkaline solution as binder resins. When such resists are dipped in a stripping solution consisting of aqueous alkaline solution alone in the stripping step after exposure, the cured resists become swollen and are stripped off, without being in fragments, keeping the shape of the pattern. Consequently, there arise problems that the stripped product winds itself around the carrier roller of the stripping machine and that the part of cured resist held underneath overhanging plating is difficultly stripped off.

Accordingly, the cured resist is usually stripped off by dissolving a part of it by using, for example, 5% aqueous sodium hydroxide solution incorporated with such organic solvents as butyl cellosolve.

The use of such stripping procedure increases the cost of chemicals, which causes the increase of production cost of printed circuit boards.

Meanwhile, the following two processes have hitherto been mainly used for producing aqueous-developing type dry film resists. The first process comprises preparing a binder resin in dry state by various methods, dissolving the resin in a solvent together with a crosslinkable monomer, a photoinitiator and other additives to prepare a coating dope, coating the dope on a support, and then drying the coating to evaporate off the solvent and thus obtain a dry film. The second process comprises preparing a polymer solution by polymerizing a binder resin by means of solution polymerization, mixing and dissolving into the solution a crosslinkable monomer, a photoinitiator and other additives to prepare a coating dope, coating the dope on a support, and then drying the coating to evaporate off the solvent and thus obtain a dry film.

The methods of polymerization used in producing binder resins employed for aqueous-developing type dry film resists are mainly of radical reaction type and include four kinds of known methods, namely bulk, solution, suspension and emulsion polymerization. In producing binder resins having a high content of carboxyl groups, suspension polymerization and emulsion polymerization can be hardly used since vinyl monomers containing a carboxyl group is soluble in water.

In the first process for production mentioned above, when method of solution polymerization is used, for preparation of binder resins in dry state, operations of reprecipitation and drying are necessary after polymerization, so that it is required to use a solvent two times in the dry film production process. On the other hand, when method of bulk polymerization is used, the obtained polymer must be crushed so that it may easily be dissolved in preparing the coating dope and, moreover, the control of polymerization is difficult, which increase the cost of industrial production. In any case the first process has the difficulty of high production cost.

In the second process for production mentioned above, the polymerization solvent to be used should be those which can dissolve not only the monomer and the formed polymer well but also other constituents than the binder resin and can be easily removed from the applied coating dope by drying at a sufficiently low temperature which causes no thermoset of the dry film resist and in a short time. Co-solvent consisting of methylene chloride and methyl alcohol as disclosed in Japanese Patent Application Kokai (Laid-open) No. 147,323/75 is an extremely excellent solvent for vinyl addition polymers containing carboxyl groups and can be removed by drying very easily. However, its boiling point is very low, resulting in low polymerization temperature and insufficient polymerization velocity, which renders practically useful polymerization substantially impossible. Moreover, it gives only very low molecular weight polymers. Accordingly, it cannot be used as the polymerization solvent for the above-mentioned purpose. On the other hand, the use of methyl cellosolve as the polymerization solvent as disclosed in Japanese Patent Application Kokai (Laid-open) No. 94,388/77 is industrially advantageous in that it allows a wide range of polymerization temperature since the solvent has a high boiling point, but it requires high heat load in drying of the applied coating dope and results in low productivity of dry film resists.

OBJECT OF THE INVENTION

The object of the present invention is to provide, by overcoming the problems of prior arts mentioned above, a photopolymerizable resin composition enabling the production of an full-alkali type dry film resist which can be developed with aqueous alkaline solution alone and which undergoes fragmental peeling, wherein the stripped resist is broken into small pieces as in prior solvent-developing type resist, by the action of aqueous alkaline solution alone in the stripping step and a process capable of producing the said photopolymerizable resin composition industrially advantageously.

CONSTRUCTION OF THE INVENTION

The photopolymerizable resin composition of the present invention comprises
(A) 40 to 85% by weight of a binder resin comprising a copolymer of methyl methacrylate, methyl acrylate and methacrylic acid,
(B) 15 to 60% by weight of a crosslinkable monomer having at least two ethylenically unsaturated groups in the molecule, and
(C) 0.5 to 10% by weight, based on the total amount of the above components (A) and (B), of a photoinitiator.

The binder resin constituting the composition of the present invention comprises a copolymer obtained by polymerizing a monomer mixture consisting of methyl methacrylate, methyl acrylate and methacrylic acid. The copolymer to be used has preferably methacrylic acid unit content in the range of 15 to 50% by weight, particularly 20 to 50% by weight. When the content of methacrylic acid units of the binder resin used is less than 15% by weight, the cured resist is swollen and peeled off in the stripping operation. When the content exceeds 50% by weight, the development time becomes very short, which makes the control of development difficult in obtaining high resolution patterns, and further the water resistance of cured parts decreases. The methyl acrylate unit content in the copolymer to be used is preferably in the range of 2 to 70% by weight, particularly 5 to 60% by weight. When the content of methyl acrylate monomer units is less than 2% by weight, the film of cured resist obtained from the copolymer is hard and liable to peel off. When it exceeds 70% by weight, the development time becomes short and the control of development in obtaining high resolution patterns is difficult.

The binder resins used in this invention have a weight average molecular weight in the range of 40,000 to 300,000. When the weight average molecular weight is less than 40,000, a so-called cold flow phenomenon occurs, wherein the resist composition oozes out of the gap of supporting film with lapse of time, when a dry film resist obtained from such resins is wound into a roll and stored. When it exceeds 300,000, the unexposed part is insoluble making the development impossible, or an extremely long time is required for development resulting in decreased resolution, or fragmental peeling does not take place in stripping operation.

The crosslinkable monomers having at least two ethylenically unsaturated groups in the molecule constituting the composition of this invention include, for example, polyester acrylates and polyester methacrylates such as polyethylene glycol diacrylate, polyethylene glycol dimethacrylate, propylene glycol diacrylate, propylene glycol dimethacrylate, 1,3-butanediol diacrylate, 1,3-butanediol dimethacrylate, 1,4-butanediol diacrylate, 1,4-butanediol dimethacrylate, neopentylglycol diacrylate, neopentylglycol dimethacrylate, 1,6-hexanediol diacrylate, 1,6-hexanediol dimethacrylate, trimethylolpropane triacrylate, trimethylol propane trimethacrylate, pentaerythritol diacrylate, penthaerythritol dimethacrylate, pentaerythritol triacrylate, pentaerythritol trimethacrylate, pentaerythritol tetraacrylate and pentaerythritol tetramethacrylate and also epoxy acrylates and epoxy methacrylates and urethane acrylates and urethane methacrylates. They are used either alone or in combinations of two or more thereof.

The binder resin and the crosslinkable monomer are compounded in proportions of 40 to 85% by weight of the former and 15 to 60% by weight of the latter. When the proportion of the binder resin is less than 40% by weight, the coating dope cannot be applied uniformly, or migration or cold flow phenomenon will occur in the resist layer after drying. On the other hand, when it exceeds 85% by weight, the exposed part of the resist will dissolve repidly in developing solution making the development impossible.

The photoinitiators constituting the composition of this invention include, for example, benzoin, benzoin alkyl ethers, benzophenone, Michler's ketone, 4,4'-bis(-diethylamino)benzophenone, acetophenones, benzyl ketals, anthraquinones and thioxanthones. These are used each alone or in combination thereof. The amount of the photoinitiator to be used is preferably in the range of 0.5 to 10% by weight based on the total amount of the above-mentioned binder resin and crosslinkable monomer in the composition.

The photopolymerizable resin composition of this invention can be prepared, though not particularly limitatively, by a process which comprises drying a composition to evaporate off solvents therefrom, said composition being formed by mixing (A) a resin solution formed by dissolving in a solvent a binder resin comprising a copolymer of methyl methacrylate, methyl acrylate and methacrylic acid, (B) a crosslinkable monomer having at least two ethylenically unsaturated groups in the molecule, and (C) a photoinitiator to form a solution.

The resin solution containing a binder resin dissolved therein may be prepared by dissolving the binder resin in a solvent, but is preferably prepared by solution polymerization of methyl methacrylate, methyl acrylate and methacrylic acid in a solvent.

The solvents used in the solution polymerization are isopropyl alcohol or those which comprise isopropyl alcohol as the principal component.

Since isopropyl alcohol, which is the principal component of polymerization solvent used in this invention, can not only dissolve the binder resin having a high content of carboxyl groups and monomers thereof but also make the polymerization temperature sufficiently high, polymers of high conversion required for binder resins can be prepared in a short time by the use of the solvent. Further, since isopropyl alcohol vaporizes rapidly and can be evaporated off in drying in a short time at a low temperature where thermosetting of the dry film will not occur, it is very advantageous for producing dry film.

Polymerization solvents to be added to isopropyl alcohol can be used in a range of amount not exceeding 20% by weight based on the total weight of the mixed solvent. Those solvents may be used as such co-solvents which can dissolve monomers and polymers formed therefrom and have a boiling point of 80° C. or lower. Suitable co-solvents vary depending on the kind of thermoplastic polymers for binder. For example, methylene chloride and methyl ethyl ketone are effectively used as additives to the polymerization solvent for methyl methacrylate/methacrylic acid type copolymers.

The solution polymerization in the present invention can be conducted by any method selected from thermal polymerization, photopolymerization and radiation polymerization. In the case of polymerizing a large quantity of monomer, however, thermal polymerization is more suitable from the point of necessary equipment.

The polymerization initiators to be used in the polymerization of binder resins include, for example, peroxides such as acetyl peroxide, benzoyl peroxide and lauroyl peroxide and azo compounds such as azobisisobutyronitrile, azobis-2,4-dimethylvaleronitrile and azobiscyclohexanecarbonyl. Further, modifiers such as aldehydes and mercaptans may be added to regulate properly the polymerization degree of the resultant polymer.

The amount of polymerization solvent used in the solution polymerization is not restricted specifically, but it is preferably in a range which will give a solid content of the binder resin of 50% by weight or less for ease of handling.

The binder resin solution prepared as mentioned above is liable to undergo phase separation at low temperatures. Accordingly, when the binder resin solution is put up in cans, transported, and taken out from the can to formulate a coating dope, it must be heated again to be brought back into solution. To dispense with this operation, a solvent for improving the solubility of binder resin is newly added. Preferred such solvents are those which have an ability to dissolve well the binder resin by forming co-solvents with the polymerization solvents and have a low boiling point. For example, methyl ethyl ketone and methylene chloride can be effectively used as such solvents. The amount of the solvents to be added for improving solubility is preferably 2.5 to 500% by weight based on the weight of the polymerization solvent.

After a binder resin solution has been obtained by solution polymerization using the above-mentioned mixed solvent comprising isopropyl alcohol as the principal component, a solvent for improving the solubility of the binder resin is added thereto, and the resulting binder resin solution is mixed with a crosslinking agent and a photoinitiator to form a coating dope. The coating dope may further contain such ingredients as adhesion accelerators, thermal-polymerization inhibitors, dyes, plasticizers and fillers added thereto.

For mixing and stirring operation in the preparation of the coating dope, propeller type, reversal rotating type, and kneader type mixers are mainly used.

The coating solution prepared as described above is coated on a support, and then the solvent is evaporated off. Application of the coating dope on the support may be conducted by using blade coaters, rod coaters, knife coaters, roll doctor coaters, comma coaters, reverse roll coaters, transfer roll coaters, gravure coaters, kiss-roll coaters, curtain coaters and the like. These can be selected depending upon coating weight, viscosity of coating dope, coating velocity and other factors. Plastic films such as that of polyester are mainly used as the support. As to dryers, those which are equipped with heat sources of air heating type using steam are used for the sake of safety owing to the use of inflammable solvents. Those of a type wherein hot air in the dryer is contacted countercurrently with the support or wherein the air is blown against the support from a nozzle are used. The shapes of the dryer used, which include arch-type and flat-type, are selected properly in accordance with purposes.

If necessary, the dry film of the dryer may be laminated with protective films such as polyethylene and polypropylene films.

The amount of coating dope to be applied on the support is such that it gives a solid thickness of 10 to 100 μm after drying. The drying is effected at a temperature of 20° C. to 105° C. for 2 to 30 minutes.

EFFECT OF THE INVENTION

The dry film resist formed of the composition produced as described above is, also as resist for etching or that for plating, excellent in storability, processability and property to pass smoothly through process steps and can give a high resolution pattern. However, its most remarkable feature is that the stripping step can be effected with aqueous alkaline solution alone. Consequently, it has completely got rid of the increase in production cost of printed circuit boards which results from addition of solvents such as butyl carbitol to aqueous alkaline solution previously conducted to obtain fragmentary stripped pieces. Further, in producing the dry film resist mentioned above, the method which comprises conducting a solution polymerization using a solvent comprising isopropyl alcohol as the principal component, adding to the resulting solution a solvent for improving the solubility of binder resin to prepare a binder resin solution, adding to the solution additives such as crosslinking agents and photoinitiators to form a coating dope; and then coating the dope on a support followed by drying to obtain dry film resist can reduce the production cost satisfactorily as compared with prior methods.

EXAMPLES

This invention will be described more concretely below with reference to Examples.

COMPARATIVE EXAMPLE 1

A four-necked flask of 1000 ml volume was equipped with a stirrer, a condenser, a thermometer and an inlet for nitrogen. Under nitrogen atmosphere, 200 g of isopropyl alcohol, 140 g of methyl methacrylate, 20 g of methyl acrylate and 40 g of methacrylic acid were placed into the flask, and the temperature of the water bath was brought to 80° C. with stirring. Then, 1.0 g of azobisisobutyronitrile dissolved in 10 g of isopropyl alcohol was added and polymerization was conducted for 4 hours. Thereafter, 1.0 g of azobisisobutyronitrile dissolved in 10 g of isopropyl alcohol was added 5 times at 30-minute intervals and, after the fifth addition, the inner temperature was brought to the boiling point of isopropyl alcohol and polymerization was conducted at the temperature for 2 hours. After completion of the polymerization, 100 g of isopropyl alcohol was added to the reaction mixture and the polymerization product was taken out. The binder resin solution thus prepared had a Gardner viscosity of +Z6 and showed a conversion of 99.5% or more. About 5 g of the binder resin solution was placed in a 50 ml beaker, cooled in ice water at 0° C. or in a refrigerator at 7° C., and thereafter the state of phase separation was observed with the naked eye. The results obtained are shown in Table 1.

EXAMPLES 1 to 4

After solution polymerization had been conducted in the same manner as in Comparative Example 1, a solvent mixture consisting of isopropyl alcohol and methylene chloride was added in place of isopropyl alcohol to adjust the ratio of isopropyl alcohol to methylene chloride in the solvent in the final binder resin solution to 4 levels of 95/5, 90/10, 85/15 and 80/20.

The solution thus obtained was subjected to the same test as in Comparative Example 1. The results obtained are shown in Table 1.

EXAMPLES 5 to 8

Solution polymerization was conducted in the same manner as in Comparative Example 1 except that a polymerization solvent consisting of 95% by weight of isopropyl alcohol and 5% by weight of methyl ethyl ketone was used. Then, isopropyl alcohol/methyl ethyl ketone mixed solvent was added to the polymer solution obtained above so as to adjust the ratio of isopropyl alcohol to methyl ethyl ketone to 95/5, 90/10, 85/15 and 80/20.

The resulting solutions were tested in the same manner as in Comparative Example 1 and the results obtained are shown in Table 1.

TABLE 1

| | Solvent for binder resin | | In 0° C. ice water | In 7° C. refrigerator |
|---|---|---|---|---|
| Comparative Example 1 | Isopropyl alcohol | 100 | Phase separation | Phase separation |
| Example 1 | Isopropyl alcohol/ methylene chloride | 95/5 | Phase separation | No phase separation |
| Example 2 | Isopropyl alcohol/ methylene chloride | 90/10 | No phase separation | No phase separation |
| Example 3 | Isopropyl alcohol/ methylene chloride | 85/15 | No phase separation | No phase separation |
| Example 4 | Isopropyl alcohol/ methylene chloride | 80/20 | No phase separation | No phase separation |
| Example 5 | Isopropyl alcohol/ methyl ethyl ketone | 95/5 | Phase separation | No phase separation |
| Example 6 | Isopropyl alcohol/ methyl ethyl ketone | 90/10 | No phase separation | No phase separation |
| Example 7 | Isopropyl alcohol/ methyl ethyl ketone | 85/15 | No phase separation | No phase separation |
| Example 8 | Isopropyl alcohol/ methyl ethyl ketone | 80/20 | No phase separation | No phase separation |

EXAMPLES 9 to 13

A coating dope having the following composition was formulated by using the binder resin solution prepared in Example 2.

| | |
|---|---|
| Binder resin solution | 275 parts by weight |
| Trimethylolpropane triacrylate | 50 parts by weight |
| Tetraethylene glycol diacrylate | 20 parts by weight |
| Benzophenone | 1.0 part by weight |
| Michler's ketone | 0.2 part by weight |
| Tolyltriazole | 0.4 part by weight |
| Methylene blue | 0.15 part by weight |

The coating dope obtained above was stirred with a propeller type mixer and coated on polyester film 25 μm thick and 360 mm wide to give a coating width of 340 mm by means of a blade coater. Then, the coated film was passed through a flat-type dryer 400 mm in width, 100 mm in height and 8 m in length while hot air was blown thereinto countercurrently to obtain a dry coating thickness of 50 μm. The conveying speed was 5 m/minute, air speed was 3 m/second and the temperature in the dryer was varied to 80° C., 90° C., 100° C., 110° C. and 120° C. Then, polyethylene protective film of 35 μm thickness was laminated on the dried coated film and the laminate was taken up on a roll. Then, while the protective film is being peeled off, the dry film resist obtained was hot-laminated on a copper-clad epoxy-glass board with the coated film surface facing to the board. After the temperature of the copper-clad epoxy-glass board had returned to room temperature, a photo-tool was placed in close contact with the polyester film surface and exposure was conducted by using a superhigh pressure mercury lamp. A line-and-space pattern having a width of 50 μm, 60 μm, 80 μm and 100 μm was used as the photo-tool. The superhigh pressure mercury lamp used was USH-102D (mfd. by Ushio Denki Co.), the irradiation being conducted at 100 mJ/cm². The exposure intensity was made 5 mW/cm² as determined by an ultraviolet radiation intensity meter UIT-100 (mfd. by Ushio Denki Co.) with a photo-detector UVD-365P attached thereto. After standing for 20 minutes following the exposure, the supporting film was peeled off and the resist was developed with 2% aqueous sodium carbonate solution. The developing was conducted at liquid temperature of 30° C., spray pressure of 1.4 kg/cm² and with a distance between the spray and the substrate of 10 cm. Then, the resist was immersed in aqueous neutral-detergent solution at room temperature for about one minute to remove fat, washed with water spray in an overflow tank for about one minute, and then immersed in about 20% aqueous ammonium persulfate solution for one minute. After washed with water spray again for about one minute, it was immersed in about 15% aqueous sulfuric acid for one minute and then again washed with water spray for one minute. Then, it was placed in a copper sulfate plating bath and plated at a current density of 2.3 A/dm² for 75 minutes at a temperature of 22° C. Immediately after completion of the plating, it was washed with water, immersed in 15% aqueous fluoroboric acid solution, and then subjected to high throwing power solder plating at 1.8 A/dm² for 18 minutes at 22° C.

The solder plating solution had the following composition:

| | |
|---|---|
| Tin | 15 g/l |
| Lead | 10 g/l |
| Free fluoroboric acid | 400 g/l |
| Free boric acid | 21.6 g/l |
| Peptone | 5.2 g/l |

After completion of the plating, the system thus obtained was washed with water and then dried. The content of residual solvent, developing property and resistance to plating of the dry film were shown in Table 2. Drying at high temperature causes thermosetting of the resist making the development impossible. A large content of residual solvent causes crawling in the plating and cold flow phenomenon.

EXAMPLES 14 to 18

Dry film resists were produced and evaluated in the same manner as in Examples 9 to 13 but by using the binder resin solution prepared in Example 6. The results obtained are shown in Table 2.

COMPARATIVE EXAMPLES 2 to 6

A binder resin solution was prepared in the same manner as in Comparative Example 1 except for using methyl cellosolve as the polymerization solvent in place of isopropyl alcohol. Dry film resists were produced and evaluated in the same manner as in Examples 9 to 13. The results obtained are shown in Table 2.

TABLE 2

| | Solvent | Drying temp. | Residual solvent | Developing property | Resistance to plating |
|---|---|---|---|---|---|
| Example 9 | Isopropyl alcohol/ methylene chloride (90/10) | 80° C. | 0.40% | Good | Good |
| Example 10 | Isopropyl alcohol/ methylene chloride (90/10) | 90° C. | 0.05% | " | " |
| Example 11 | Isopropyl alcohol/ | 100° C. | 0.02% | " | " |

TABLE 2-continued

|  | Solvent | Drying temp. | Residual solvent | Developing property | Resistance to plating |
|---|---|---|---|---|---|
|  | methylene chloride (90/10) |  |  |  |  |
| Example 12 | Isopropyl alcohol/ methylene chloride (90/10) | 110° C. | 0.01% or less | " | " |
| Example 13 | " | 120° C. | 0.01% or less | Unexposed part is difficultly soluble | " |
| Example 14 | Isopropyl alcohol/ methyl ethyl ketone (90/10) | 80° C. | 1.08% | Good | Good |
| Example 15 | Isopropyl alcohol/ methyl ethyl ketone (90/10) | 90° C. | 0.30% | " | " |
| Example 16 | Isopropyl alcohol/ methyl ethyl ketone (90/10) | 100° C. | 0.07% | " | " |
| Example 17 | Isopropyl alcohol/ methyl ethyl ketone (90/10) | 110° C. | 0.02% | " | " |
| Example 18 | Isopropyl alcohol/ methyl ethyl ketone (90/10) | 120° C. | 0.01% or less | Unexposed part is difficultly soluble | Good |
| Comparative Example 2 | Methyl cellosolve | 80° C. | 6.53% | Impossible due to cold flow | — |
| Comparative Example 3 | " | 90° C. | 5.17% | Impossible due to cold flow | — |
| Comparative Example 4 | " | 100° C. | 4.21% | Impossible due to cold flow | — |
| Comparative Example 5 | " | 110° C. | 2.36% | Good | Resist peels off |
| Comparative Example 6 | " | 120° C. | 1.41% | Unexposed part is difficulty soluble | Partly crawling |

EXAMPLES 19 to 27

COMPARATIVE EXAMPLES 7 to 9

Dry film resists were obtained by using the same polymerization conditions, solvent addition ratio, coating dope composition, coating method and drying method as those used in Example 11 except for varying the binder resin composition as shown in Table 3.

The dry film was subjected to optimum development by the same developing method as in Example 11 and then subjected to stripping using 5% aqueous sodium hydroxide solution. The stripping was conducted with the temperature of the stripping solution being adjusted to 55° C., the spray pressure being 1.0 kg/cm² and the distance between the spray and the substrate being 10 cm.

The weight average molecular weights of the binder resins thus prepared and the results obtained by observing stripped pieces with the naked eye are shown in Table 3.

TABLE 3

|  | Binder resin | | Weight average molecular weight | Evaluation results | | |
|---|---|---|---|---|---|---|
|  | Monomer composition | (weight ratio) |  | Developing property | Resistance to plating solution | State of stripped pieces |
| Example 19 | Methyl methacrylate/ Methyl acrylate/ Methacrylic acid | (65/10/25) | 88,000 | 60 μm resolution | Good | Swelling, partly cracking |
| Example 20 | Methyl methacrylate/ Methyl acrylate/ Methacrylic acid | (55/20/25) | 103,000 | " | " | Fragment |
| Example 21 | Methyl methacrylate/ Methyl acrylate/ Methacrylic acid | (45/30/25) | 114,000 | " | " | " |
| Example 22 | Methyl methacrylate/ Methyl acrylate/ Methacrylic acid | (35/40/25) | " | " | " | " |
| Example 23 | Methyl methacrylate/ Methyl acrylate/ Methacrylic acid | (75/10/15) | 103,000 | " | " | Swelling |
| Example 24 | Methyl methacrylate/ Methyl acrylate/ Methacrylic acid | (70/10/20) | 114,000 | " | " | Swelling, partly cracking |
| Example 25 | Methyl methacrylate/ Methyl acrylate/ Methacrylic acid | (60/10/30) | 115,000 | " | " | Fragment |
| Example 26 | Methyl methacrylate/ Methyl acrylate/ Methacrylic acid | (50/10/40) | 118,000 | 100 μm resolution | " | " |

TABLE 3-continued

| | Binder resin | | Weight average molecular weight | Evaluation results | | |
|---|---|---|---|---|---|---|
| | Monomer composition | (weight ratio) | | Developing property | Resistance to plating solution | State of stripped pieces |
| Example 27 | Methyl methacrylate/ Methyl acrylate/ Methacrylic acid | (40/10/50) | " | 200 μm resolution | " | " |
| Comparative Example 7 | Methyl methacrylate/ Ethyl acrylate/ Methacrylic acid | (65/10/25) | 101,000 | 60 μm resolution | " | Swelling |
| Comparative Example 8 | Methyl methacrylate/ Butyl acrylate/ Methacrylic acid | (65/10/25) | 96,000 | " | " | " |
| Comparative Example 9 | Methyl methacrylate/ 2-Ethylhexyl acrylate/ Methacrylic acid | (65/10/25) | 89,000 | " | " | " |

What is claimed is:

1. A photopolymerizable resin composition which comprises
   (A) 40 to 85% by weight of a binder resin comprising a copolymer of methyl methacrylate, methyl acrylate, and methacrylic acid, wherein the methacrylic acid unit content of the copolymer constituting the binder resin is 20 to 50% by weight and the methyl acrylate unit content of the copolymer constituting the binder resin is 2 to 70% by weight,
   (B) 15 to 60% by weight of a crosslinkable monomer having at least two ethylenically unsaturated groups in the molecule, and
   (C) 0.5 to 10% by weight, based on the toal amount of the above components (A) and (B), of a photoinitiator.

2. A photopolymerizable resin composition according to claim 1 wherein the weight average molecular weight of the binder resin is 40,000 to 300,000.

3. A photopolymerizable resin composition according to claim 1 wherein the crosslinkable monomer is a member selected from the group consisting of polyester acrylate, polyester methacrylates, epoxy acrylate, epoxy methacrylates urethane acrylate and urethane methacrylates.

4. A photopolymerizable resin composition according to claim 1 wherein the photoinitiator is a member selected from the group consisting of benzophenone, Michler's ketone, 4,4-bis(diethylamino)benzophenone, anthraquinones, acetophenones, thioxanthones, benzoin alkyl ethers and benzyl ketals.

* * * * *

UNITED STATES PATENT AND TRADEMARK OFFICE
CERTIFICATE OF CORRECTION

PATENT NO.  : 4,692,396
DATED       : September 8, 1987
INVENTOR(S) : Uchida

It is certified that error appears in the above-identified patent and that said Letters Patent is hereby corrected as shown below:

On the first page below the inventor's name, insert -- Assignee: Mitsubishi Rayon Co., Ltd., Tokyo, Japan --.

In column 2, line 2, change "is" to --are--.

In column 3, line 48, change "penthaery" to --pentaery--

In column 5, line 61, change "property" to --ability--.

In column 7, line 49, change "is" to --was--.

In column 8, line 17, insert --being-- before "washed"

In column 8, line 39, change "were" to --are--.

In column 9, Example 13, solvent column, insert --Isopropyl alcohol/methylene chloride (90/10)--.

Signed and Sealed this

Thirty-first Day of January, 1989

Attest:

DONALD J. QUIGG

*Attesting Officer*       *Commissioner of Patents and Trademarks*